(12) United States Patent
Kanawade et al.

(10) Patent No.: US 8,382,180 B2
(45) Date of Patent: Feb. 26, 2013

(54) ADVANCED FI BLADE FOR HIGH TEMPERATURE EXTRACTION

(75) Inventors: Dinesh Kanawade, Sunnyvale, CA (US); Craig R. Metzner, Simi Valley, CA (US); Chandrasekhar Balasubramanyam, Bangalore (IN)

(73) Assignee: Applied Material, Inc., Santa Clara, CA (US)

( * ) Notice: Subject to any disclaimer, the term of this patent is extended or adjusted under 35 U.S.C. 154(b) by 374 days.

(21) Appl. No.: 12/261,574

(22) Filed: Oct. 30, 2008

(65) Prior Publication Data

US 2009/0110520 A1   Apr. 30, 2009

Related U.S. Application Data

(60) Provisional application No. 60/984,188, filed on Oct. 31, 2007.

(51) Int. Cl.
*B66F 19/00* (2006.01)
(52) U.S. Cl. .......... 294/213; 294/902; 414/941
(58) Field of Classification Search ........ 294/1.1, 294/902, 103.1; 414/935, 941
See application file for complete search history.

(56) References Cited

U.S. PATENT DOCUMENTS

| | | | |
|---|---|---|---|
| 4,715,637 A | 12/1987 | Hosoda et al. | |
| 5,556,147 A | 9/1996 | Somekh et al. | |
| 5,702,228 A | 12/1997 | Tamai et al. | |
| 6,167,322 A | 12/2000 | Holbrooks | |
| 6,206,441 B1 | 3/2001 | Wen et al. | |
| 6,634,686 B2 * | 10/2003 | Hosokawa | 294/1.1 |
| 6,685,422 B2 * | 2/2004 | Sundar et al. | 414/744.5 |
| 6,709,218 B1 | 3/2004 | Freerks et al. | |
| 6,722,834 B1 | 4/2004 | Tepman | |
| 6,737,826 B2 | 5/2004 | Gilchrist | |
| 6,896,304 B2 | 5/2005 | Li et al. | |
| 6,918,735 B2 * | 7/2005 | Urban et al. | 414/729 |
| 7,654,596 B2 * | 2/2010 | Mantz | 294/103.1 |
| 7,748,760 B2 * | 7/2010 | Kushida et al. | 294/1.1 |
| 2004/0113444 A1 * | 6/2004 | Blonigan et al. | 294/1.1 |
| 2005/0017529 A1 | 1/2005 | Rogers et al. | |
| 2005/0072716 A1 | 4/2005 | Quiles et al. | |
| 2005/0095111 A1 | 5/2005 | Kim et al. | |
| 2007/0029227 A1 | 2/2007 | Bonora | |
| 2007/0151515 A1 | 7/2007 | Kim | |
| 2007/0177963 A1 | 8/2007 | Tang et al. | |

FOREIGN PATENT DOCUMENTS

| | | |
|---|---|---|
| JP | 55-118631 | 9/1980 |
| JP | 2005-026668 | 1/2005 |

OTHER PUBLICATIONS

Notice to File a Response dated Aug. 30, 2010 for Korean Patent Application No. 2008-0014574.

* cited by examiner

*Primary Examiner* — Dean Kramer
*Assistant Examiner* — Stephen Vu
(74) *Attorney, Agent, or Firm* — Patterson & Sheridan, LLP (57) ABSTRACT

An apparatus for transferring substrates in a processing system where the substrate is exposed to high temperatures is provided. In one embodiment a blade for transporting a substrate is provided. The blade comprises a base having an arcuate lateral shoulder, a first finger extending outward from and perpendicular to the base, a second finger extending outward from the base and parallel to and spaced-apart from the first finger, a first support tab configured to support the substrate and positioned along the arcuate lateral shoulder, a second support tab configured to support the substrate and coupled with the first finger, and a third support tab configured to support the substrate coupled with the second finger, wherein the arcuate lateral shoulder extends from an outer edge of the first finger to an outer edge of the second finger.

6 Claims, 8 Drawing Sheets

ADVANCED FI BLADE FOR HIGH TEMPERATURE EXTRACTION

CROSS-REFERENCE TO RELATED APPLICATIONS

This application claims benefit of U.S. Provisional Patent Application Ser. No. 60/984,188, filed Oct. 31, 2007, which is herein incorporated by reference.

BACKGROUND OF THE INVENTION

1. Field of the Invention

Embodiments of the present invention generally relate to an apparatus and method for transferring substrates in a processing system. More specifically, embodiments of the present invention relate to a blade, for use with high temperature processes, designed to reduce thermal stress on a substrate.

2. Description of the Related Art

The effectiveness of a substrate fabrication process is often measured by two related and important factors, which are device yield and the cost of ownership (CoO). These factors are important since they directly affect the cost to produce an electronic device and thus a device manufacturer's competitiveness in the market place. The CoO, while affected by a number of factors, is greatly affected by the system and chamber throughput, or simply the number of substrates per hour processed using a desired processing sequence. In an effort to reduce CoO, electronic device manufacturers often spend a large amount of time trying to enhance the process sequence and chamber processing time to achieve the greatest substrate throughput possible given the cluster tool architecture limitations and the chamber processing times. A significant portion of the time it takes to complete the processing sequence is taken up transferring the substrates between the various processing chambers.

Figure 1:
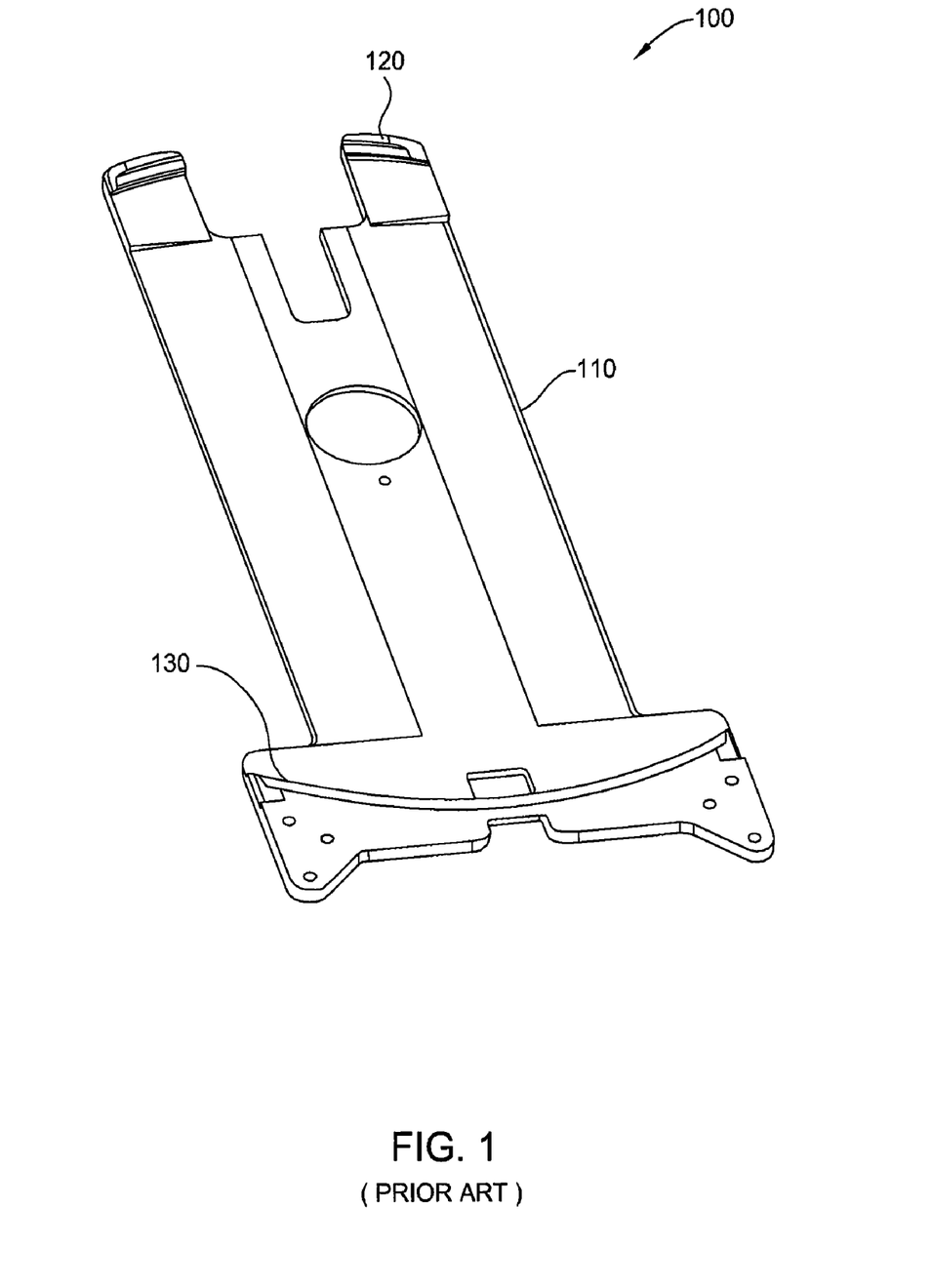
FIG. 1 illustrates a prior art blade used for extracting substrates from processing chambers.

Semiconductor processing systems typically integrate a number of process chambers on a single platform to perform several sequential processing steps without removing the substrate from a highly controlled processing environment. Once the cluster tool has been configured with the requisite number of chambers and auxiliary equipment for performing certain process steps, the system will typically process a large number of substrates by moving the substrates through the chambers using a robot disposed in the system. The robot provides both lateral and rotational movement of a substrate on a robot blade to retrieve, transfer, and deliver substrates from one location within the system to another location. Current practice also includes the use of robot arms to transfer substrates from a loading port into various processing chambers within a multiple chamber processing system. FIG. 1 illustrates a prior art blade 100 which is currently used for extracting substrates from processing chambers. The blade 100 has a generally flat blade surface 110 defined on either side by a first lateral shoulder 120 and a second lateral shoulder 130. The flat blade surface 110 generally supports the substrate.

Figure 2:
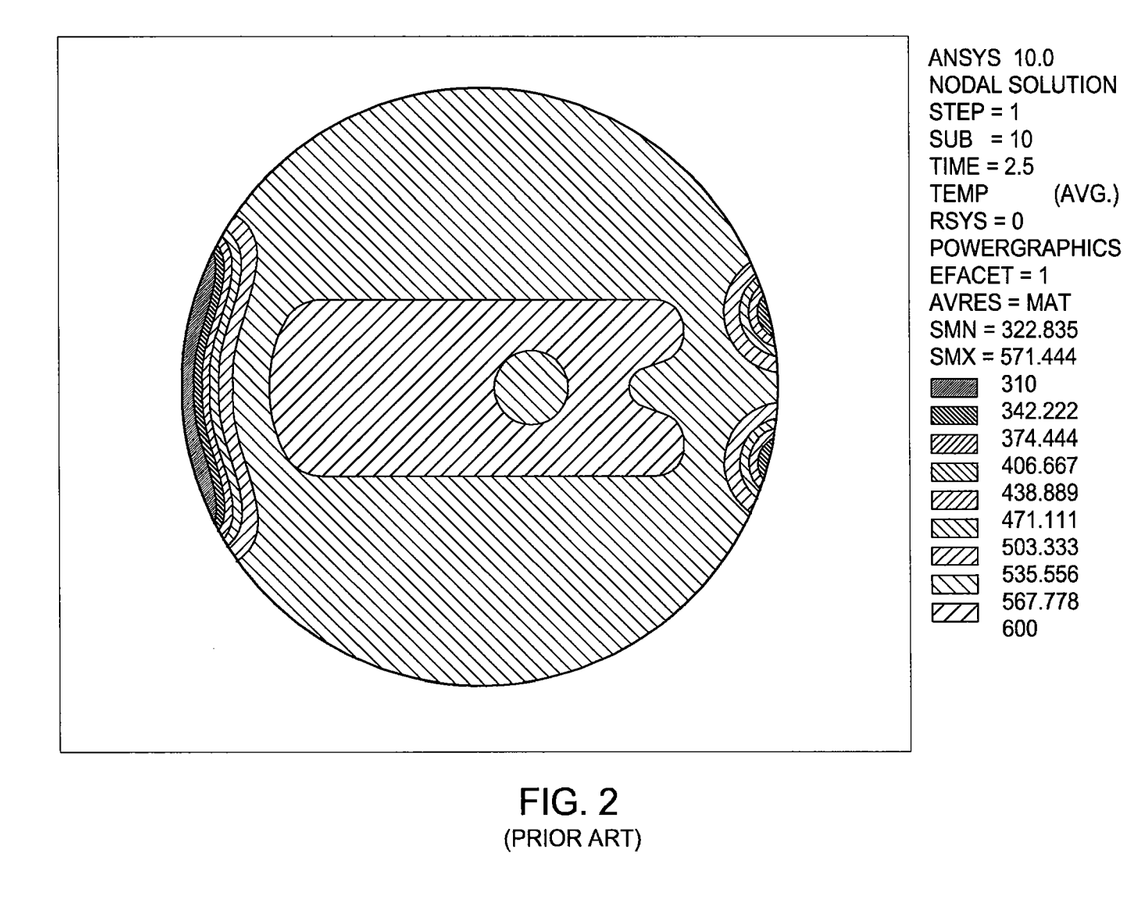
FIG. 2 depicts IR camera testing showing comparative substrate mapping as finite element analysis (FEA) of the prior art blade of FIG. 1.

Current processing recipes often require exposing the substrate to processing temperatures well in excess of 550° C. in specified process chambers. After processing, the hot substrate is extracted from the processing chamber and placed in a cooling station. However, extracting the hot substrate from the process chamber and exposing the hot substrate to a much cooler atmosphere has resulted in several problems including substrate breakage, warping, and other defects. As shown in FIG. 2, the prior art blade design of FIG. 1 places a significant amount of thermal stress on the substrate. The significant amount of material of the flat blade surface 110 under the hot substrate slows the cooling of the substrate and the prior art blade 100. As a result, current extraction temperatures are limited to 550° C. and the corresponding substrate throughput is limited because the substrate and blade must cool from the processing temperate to a minimum of 550° C. before the substrate and blade can be removed from the processing chamber.

Therefore, there is a need for a blade that allows for extraction temperatures greater than 550° C. while reducing incidences of substrate breakage and warping.

SUMMARY OF THE INVENTION

Embodiments of the present invention as recited in the claims generally provide an apparatus for transferring substrates in a processing system where the substrate is exposed to high temperatures. In one embodiment, the apparatus is a blade attached to a robot for transferring a substrate, for example, a semiconductor substrate, between processing chambers in a processing system. The blade is designed to minimize the blade surface area under the substrate and thus correspondingly reduce the thermal stress placed on the substrate after extraction from a heated processing chamber. The minimization of the robot blade area under the substrate allows for faster cooling of the blade material. The blade is also designed to reduce edge contact with the substrate thus providing reduced particle contamination of the substrate.

In one embodiment a blade for transporting a substrate is provided. The blade comprises a base having an arcuate lateral shoulder, a first finger extending outward from and perpendicular to the base, a second finger extending outward from the base and parallel to and spaced-apart from the first finger, a first support tab configured to support the substrate and positioned along the arcuate lateral shoulder, a second support tab configured to support the substrate and coupled with the first finger, and a third support tab configured to support the substrate coupled with the second finger, wherein the arcuate lateral shoulder extends from an outer edge of the first finger to an outer edge of the second finger. In certain embodiments, the blade further comprises a fourth support tab located along the arcuate lateral shoulder of the base. In certain embodiments, the first support tab and the second support tab are equidistant from the center of the base. In certain embodiments, the first support tab, the second support tab, and the third support tab from a pocket for supporting the substrate. In certain embodiments, each support tab comprises a first support surface and a second support surface. In certain embodiments, the second support surface is located inward and below the first support surface. In certain embodiments, the first support tab and the fourth support tab are positioned between about 15° and about 20° from a center line parallel to the first finger and the second finger that bisects the center of the base of the blade. In certain embodiments, the second support tab and the third support tab are positioned between about 25° and about 30° from a center line parallel to the first finger and the second finger that bisects the center of the base of the blade.

In another embodiment, a u-shaped blade for transporting a substrate is provided. The unshaped blade comprises a base having an arcuate lateral shoulder, a first finger extending outward from and perpendicular to the base, a second finger extending outward from the base and parallel to and spaced-apart from the first finger, a first support tab configured to support the substrate and positioned along the arcuate lateral shoulder, a second support tab configured to support the substrate and coupled with an angled portion of the first finger, and a fourth support tab positioned along the arcuate lateral shoulder of the base.

In yet another embodiment a system for processing a substrate is provided. The system comprises a transfer chamber, one or more processing chambers coupled with the transfer chamber, a robot assembly centrally located within the transfer chamber, and a blade coupled with the robot assembly. The u-shaped blade comprises a base having an arcuate lateral shoulder, a first finger extending outward from and perpendicular to the base, a second finger extending outward from the base and parallel to and spaced-apart from the first finger, a first support tab configured to support the substrate and positioned along the arcuate lateral shoulder, a second support tab configured to support the substrate and coupled with the first finger, and a third support tab configured to support the substrate coupled with the second finger, wherein the arcuate lateral shoulder extends from an outer edge of the first finger to an outer edge of the second finger.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures. It is contemplated that elements and/or process steps of one embodiment may be beneficially incorporated in other embodiments without additional recitation.

DETAILED DESCRIPTION

Embodiments of the present invention as recited in the claims generally provide an apparatus and method for transferring substrates in a processing system where the substrate is exposed to high temperatures and rapid cooling of the substrate is desirable. The apparatus may be attached to a robot for transferring substrates, for example, semiconductor wafers, between processing chambers in a processing system. The blade is designed to minimize the blade surface area under the substrate to reduce the thermal stress placed on the substrate after extraction from a heated processing chamber. The minimization of the blade surface area under the substrate allows for faster cooling of both the substrate and the blade material. The blade is also designed to reduce edge contact with the substrate thus providing reduced particle contamination of the substrate.

Embodiments described herein may be advantageously used in a cluster tool configuration that has the capability to process substrates in multiple single substrate processing chambers and/or multiple batch type processing chambers. A cluster tool is a modular system comprising multiple chambers that perform various processing steps that are used to form an electronic device. The blade may be used in a semiconductor device processing system, as is used in the manufacture of semiconductors on substrates, including semiconductor wafers and glass plates. Examples of systems in which the blade may be used include, for example, thermal processing systems such as the CENTURA® Epi and the Vantage RadiancePlus RTP system which are both available from Applied Materials, Inc. of Santa Clara, Calif. The blade may also be used with other processing systems produced by other manufacturers. The blade may also be used with other processing systems that are manually operated without the aide of robots.

Figure 3:
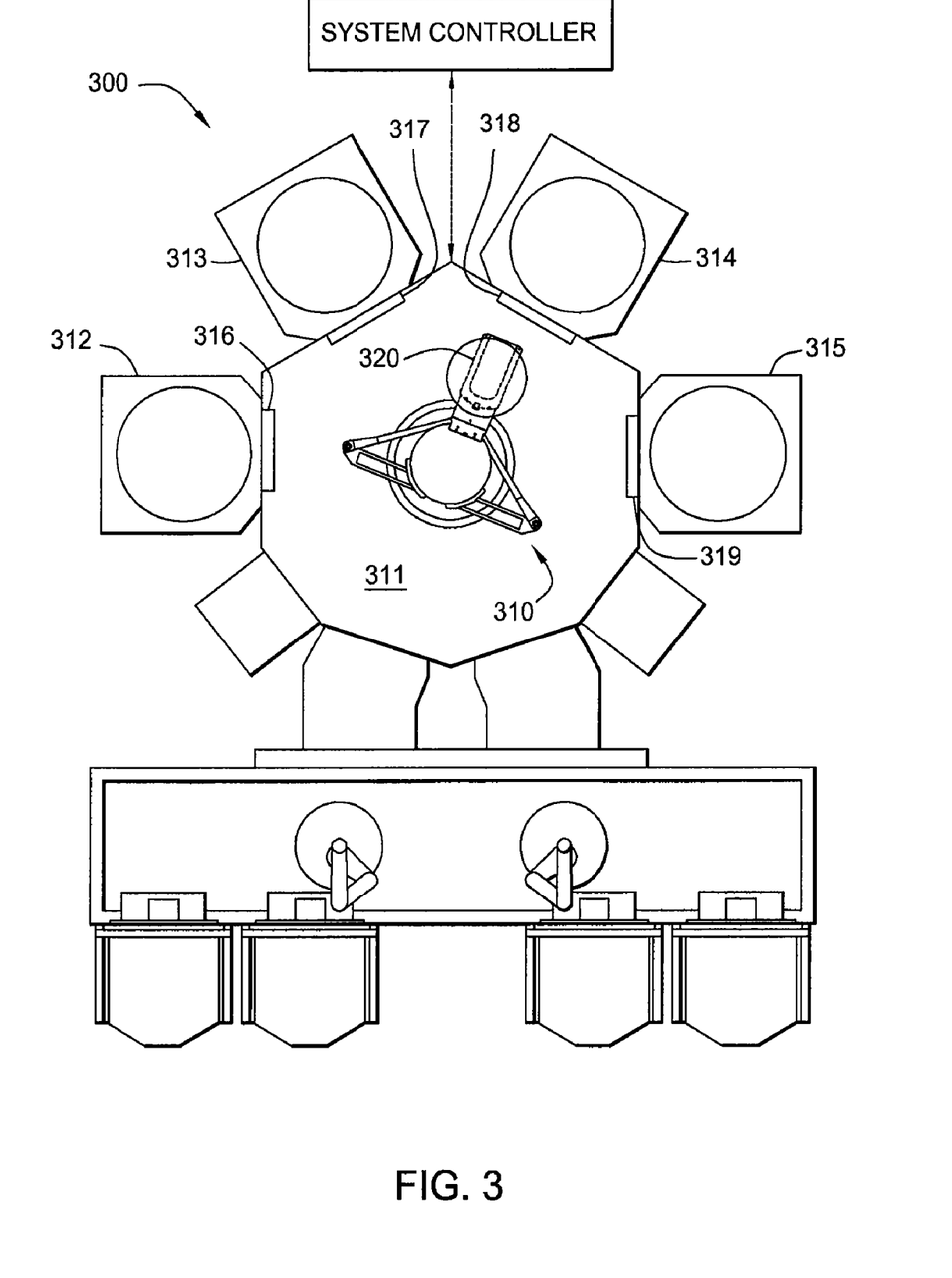
FIG. 3 is a top plan view of a multiple chamber substrate processing system.

In FIG. 3 a robot assembly 310 is shown in the context of a processing system 300. The robot assembly 310 is centrally located within a transfer chamber 311 such that substrates can be transferred to adjacent processing chambers 312, 313, 314, and 315 through valves 316, 317, 318, and 319, respectively. The robot assembly 310 may comprise a frog-leg mechanism. In certain embodiments, the robot assembly 310 may comprise any variety of known mechanical mechanisms for effecting linear extension into and out of the various process chambers. A blade 800 is coupled with the robot assembly 310. The blade 800 is configured to transfer the substrate through the processing system 300.

Figure 4:
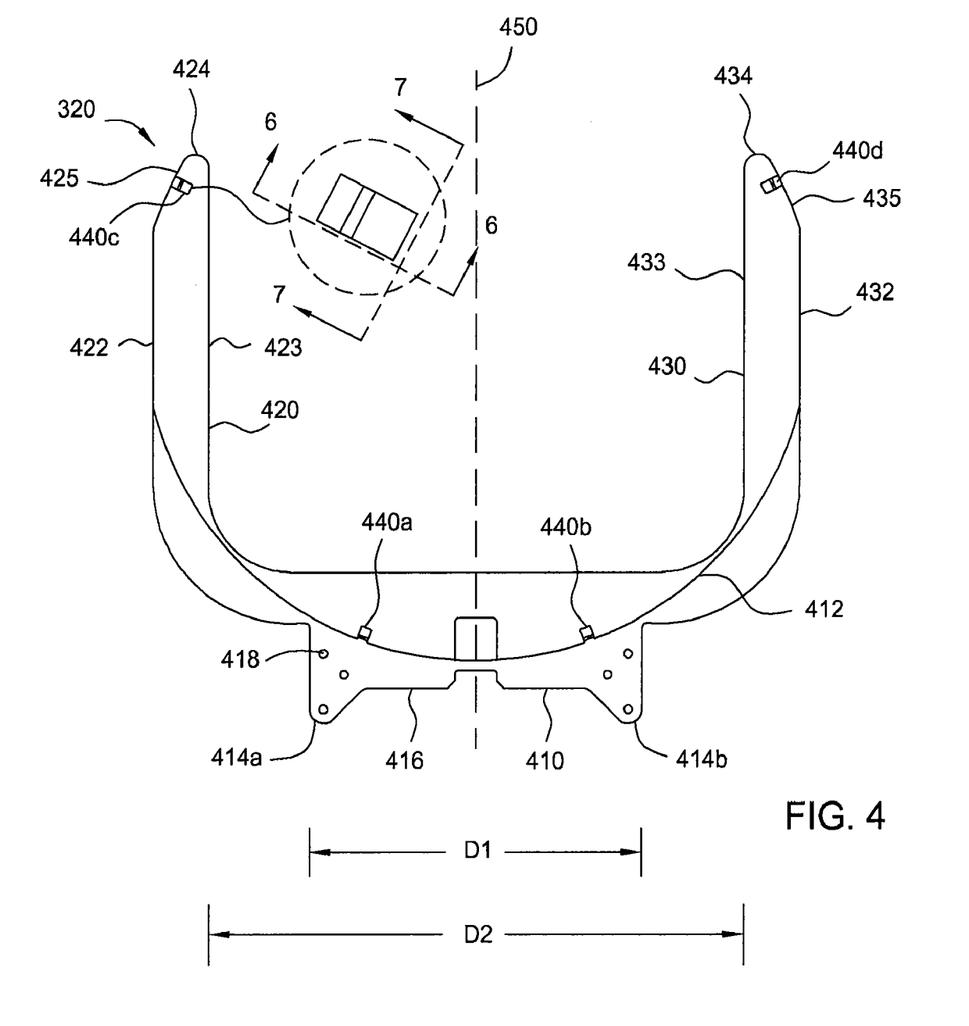
FIG. 4 is a schematic perspective view of a blade according to one embodiment described herein.

FIG. 4 is a schematic perspective view of a blade 320 according to one embodiment described herein. The blade 320 comprises a base 410 with a first finger 420 and a second finger 430 each extending outward from and perpendicular to the base forming a u-shaped blade. In certain embodiments, the first finger 420, the second finger 430, and the base 410 are manufactured as a unitary assembly. In certain embodiments, the first finger 420 and the second finger 430 may be separate pieces that are coupled with the base 410 of the blade 320 using attachment techniques known in the art.

The base 410 of the blade 320 is defined by a lateral shoulder 412. In one embodiment, the lateral shoulder 412 is arcuate in shape to conform to the shape of a circular substrate. However, the lateral shoulder 412 can be any shape to conform to the shape of the substrate being transferred. The base 410 of the blade 320 has two rearwardly facing lateral protrusions 414A, 414B and a recessed portion 416 for mounting the blade to a wrist or other mounting member of a robot assembly via fasteners such as screws disposed through holes 418. In certain embodiments, a wafer-on-blade sensor ("WOB") (not shown) may be located on the base 410 for detecting the presence of a substrate on the blade 320.

The first finger 420 and the second finger 430 are positioned so that they are equidistant from a center line 450 that bisects the base 410. The first finger 420 and the second finger 430 are also positioned to minimize the surface area of the blade 320 under the substrate that is placed above the first finger 420 and the second finger 430. Although it is preferable to minimize the surface area of the blade 320 under the substrate, the distance between the first finger 420 and the second finger 430 may be dictated by the openings and/or valves that the blade 320 will enter and exit in order to insert and retrieve substrates. For example, the first finger 420 and the second finger 430 would be positioned closer together when entering a narrow slit valve. However, where the openings and/or valves are wide, the first finger 420 and the second finger 430 would be positioned as far apart as possible to minimize the surface area of the blade 320 under the substrate while allowing for sufficient support of the substrate. In one embodiment, a distance "D2" between an inner edge 423 of the first finger 420 and an inner edge 433 of the second finger 430 is greater than a distance "D1" between the two rearwardly facing lateral protrusions of the base 410.

A portion of an outer edge 422 of the first finger 420 may be angled inward toward an end 424 of the first finger 420 to form an angled portion 425 in order to minimize the surface area of the blade 320. A portion of an outer edge 432 of the second finger 430 may be angled inward toward an end 434 of the second finger 430 to form an angled portion 435 in order to minimize the surface area of the blade 320.

One or more support tabs 440a-d may be disposed on the blade 320. A first support tab 440a and a second support tab 440b each configured to support a substrate are positioned inward from the edge of the lateral shoulder 412. The first support tab 440a and the second support tab 440b may be positioned so that the first support tab 440a and the second support tab 440b are on opposite sides of and equidistant from the center line 450 of the base 410 of the blade 320. A third support tab 440c is positioned inward from the angled portion of the outer edge 422 of the end 424 of the first finger 420. A fourth support tab 440d is positioned inward from the angled portion of the outer edge 422 of the end 424 of the second finger 430. Although the embodiment in FIG. 4 depicts four support tabs, it should be understood that any number of support tabs sufficient to support a substrate may be used. For example, a three support tab configuration in which a first support tab and a second support tab are located on the first finger 420 and the second finger 430 respectively with a third support tab located along the edge of the lateral shoulder 412 of the base 410 of the blade 320 may also be used. The support tabs 440 can be made integral to the blade 320 or can be affixed to the blade 320 by pressing, brazing, soldering, adhesively attaching, plasma spraying, arc spraying, or by using other coupling methods known in the industry.

Figure 5:
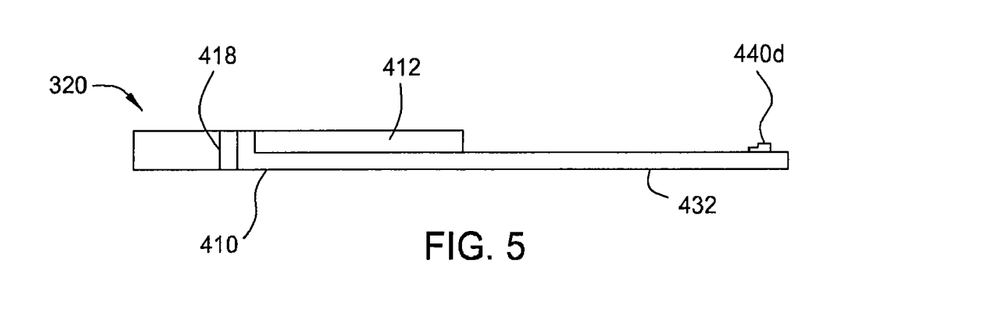
FIG. 5 is a schematic side view of the blade of FIG. 4.
Figure 6:
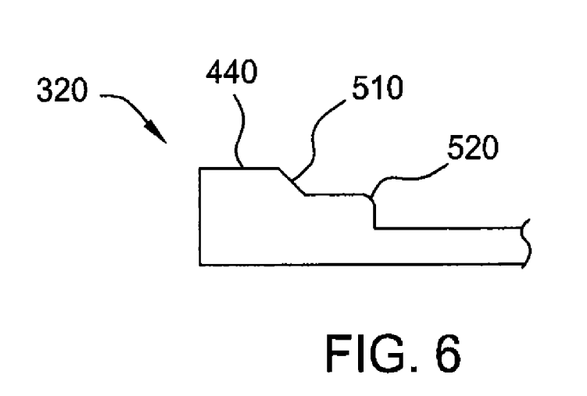
FIG. 6 is a schematic cross-sectional view taken along line 6-6 of FIG. 4.
Figure 7:
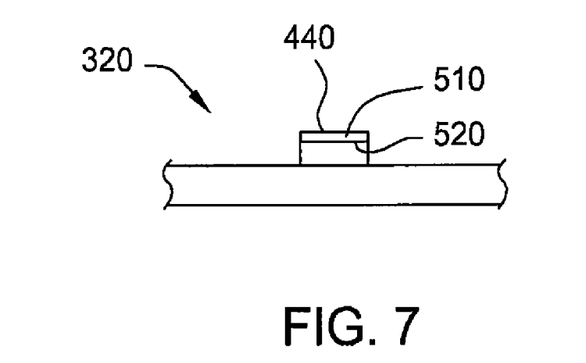
FIG. 7 is a schematic cross-sectional view taken along line 7-7 of FIG. 4.

FIG. 5 is a schematic side view of the blade of FIG. 4 showing the support tab 440d positioned at least partially above the surface of the blade 320 to provide clearance between the substrate and the surface of the blade 320. FIG. 6 is a schematic cross sectional view taken along line 6-6 of FIG. 4. A contact slope 510 is formed proximal to the forward edge 520 of each of the support tabs 440a-d. The combination of the contact slopes 510 on each of the support tabs 440a-d form a pocket for supporting the substrate. The contact slopes 510 are designed to support both a cold substrate and a hot substrate which has expanded due to the presence of heat. FIG. 7 is a schematic cross-sectional view taken along line 7-7 of FIG. 4 that shows the contact slope 510 and the forward edge 520 of a support tab.

The blade 320 is made of a stable, lightweight material that is compatible with processing conditions while supporting the substrate and allowing for rapid cooling of both the blade 320 and the substrate. The blade 320 may comprise a variety of metallic and non-metallic materials. In certain embodiments, the blade 320 may comprise a quartz material. In certain embodiments, the blade 320 may comprise a ceramic material, including, for example, alumina, alumina silicon carbide composites, silicon carbide, various insulative materials that have been doped to lower the resistivity, such as carbon-doped aluminum nitride, silicon nitride, boron nitride, and boron. In certain embodiments the support tabs 440 may comprise the same material as the blade 320. In certain embodiments, the support tabs 440 may comprise a different material from the blade 320. In certain embodiments the support tabs 440 may comprise a quartz material.

Figure 8:
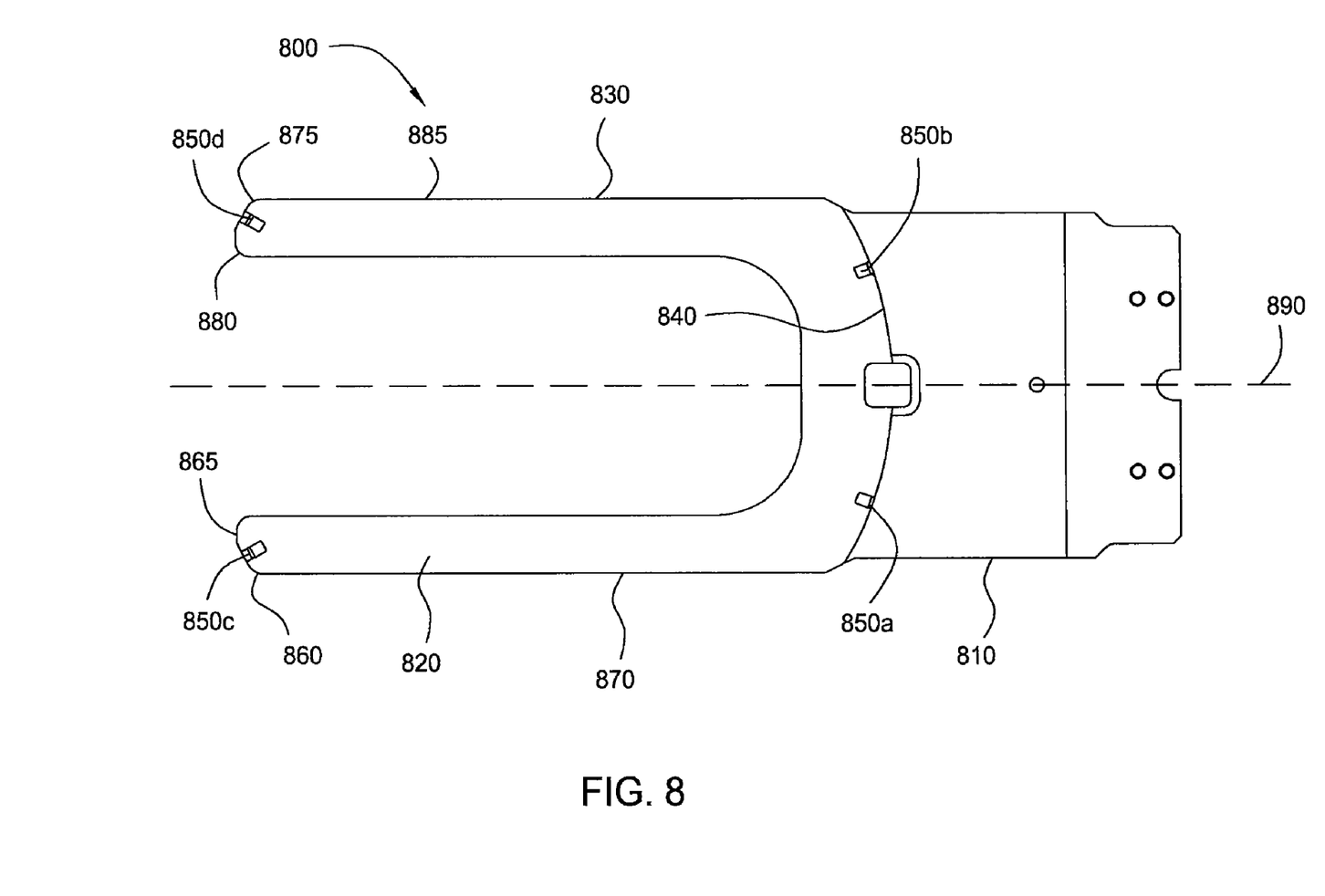
FIG. 8 is a schematic perspective view of a blade according to another embodiment described herein.

FIG. 8 is a schematic perspective view of a blade 800 according to another embodiment described herein. The blade 800 comprises a base 810 with a first finger 820 and a second finger 830 extending outward from and perpendicular to the base 810 forming a u-shaped blade. The base 810 of the blade 800 is defined by a lateral shoulder 840. In one embodiment, the lateral shoulder 840 is arcuate in shape to conform to the shape of a circular substrate. However, the lateral shoulder 840 can be any shape to conform to the shape of the substrate being transferred. The base 810 of the blade 800 is configured for mounting to a robot assembly via fasteners such as screws disposed through holes.

The first finger 820 and the second finger 830 are positioned so that they are equidistant from a center line 890 that bisects the base 810. The first finger 820 and the second finger 830 are also positioned to minimize the blade surface area under the substrate that is placed above the first finger 820 and the second finger 830. The first finger 820 and the second finger 830 may be separate pieces that are coupled with the base 810 of the robot blade 800. The first finger 820 and the second finger 830 may also be manufactured as a unitary assembly with the base 810.

One or more support tabs 850a-d are disposed on the blade 800. A first support tab 850a and a second support tab 850b each configured to support an edge of a substrate are positioned inward from the edge of the lateral shoulder 840. The first support tab 850a and the second support tab 850b may be positioned so that the first support tab 850a and the second support tab 850b are on opposite sides of and equidistant from the center line 890. A third support tab 850c is positioned inward from an angled portion 860 of the end 865 adjacent to the outer edge 870 of the first finger 820. A fourth support tab 850d is positioned inward from an angled portion 875 of the end 880 adjacent to the outer edge 885 of the second finger 830. Although the embodiment in FIG. 8 depicts four support tabs 850a-d, it should be understood that any number of support tabs sufficient to support a substrate may be used. For example, a three support tab configuration in which a first support tab and a second support tab are located on the first finger 820 and the second finger 830 respectively with a third support tab located along the edge of the lateral shoulder of the base of the blade may also be used. The support tabs can be made integral to the blade 800 or can be affixed to the blade 800 by pressing, brazing, soldering, adhesively attaching, plasma spraying, arc spraying, or by using other coupling methods known in the industry. In certain embodiments, the first support tab 850a and the second support tab 850b may be respectively positioned between about 15° and about 25°, for example, approximately 20° from a center line parallel to the first finger 820 and the second finger 830 and bisecting the center of the base 810 of the blade 800. In certain embodiments the third support tab 850c and the fourth support tab 850d may be respectively positioned between about 25° and about 30°, for example, approximately 29° from the center line 890 that bisects the center of the base 810 of the blade 800.

Figure 9:
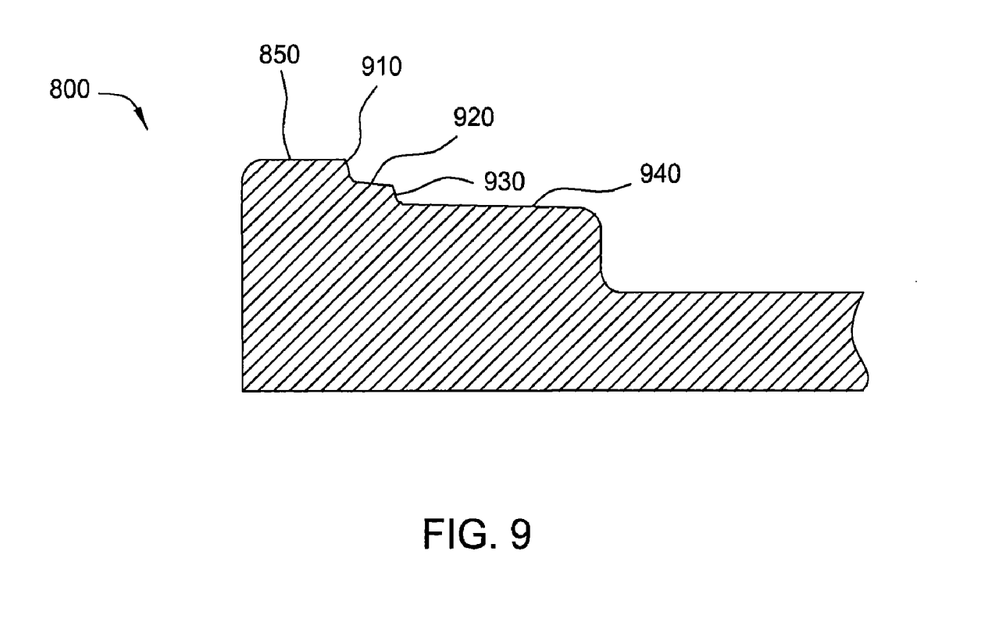
FIG. 9 is a schematic cross-sectional view taken along line 9-9 of FIG. 8.
Figure 10:
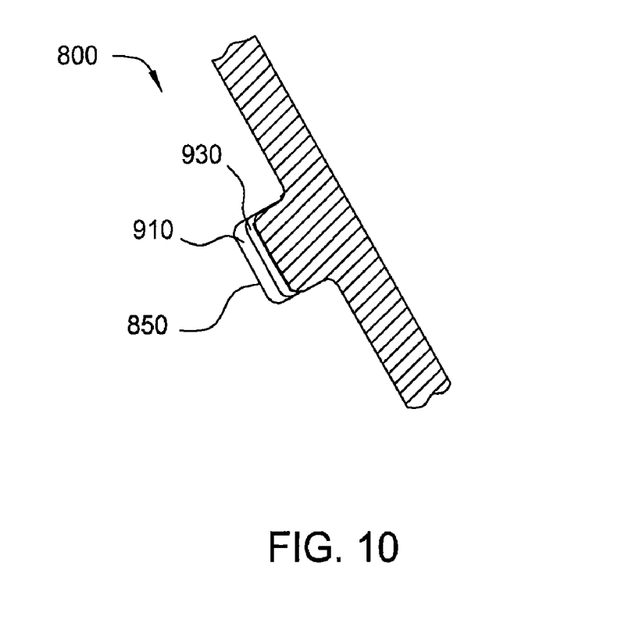
FIG. 10 is a schematic cross-sectional view taken along line 10-10 of FIG. 8.

FIG. 9 is a schematic side view of the blade of FIG. 8 showing details of the support tab 850 and the dual pocket design of the support tab 850. Each support tab 850 comprises a first contact slope 910 angled downward toward a first support surface 920 configured to support a heated substrate which has expanded. The four support tabs 850a-850d, each containing a first support surface 920 form a first pocket for supporting a substrate. The first support surface 920 leads to a second slightly downward angled surface or second contact slope 930 that leads to a second substrate support surface 940 for supporting a substrate that has cooled. The second substrate support surface 940 is located inward from the first support surface 920. The four support tabs 850a-850d each containing a second support surface 940 form a second pocket configured to support a cooled substrate. FIG. 10 is a schematic cross-sectional view that shows the first contact slope 910 and the second contact slope 930 of the support tab. The support tabs 850a-850d may be used with other blades, for example, the blade described in FIG. 4.

Figure 11:
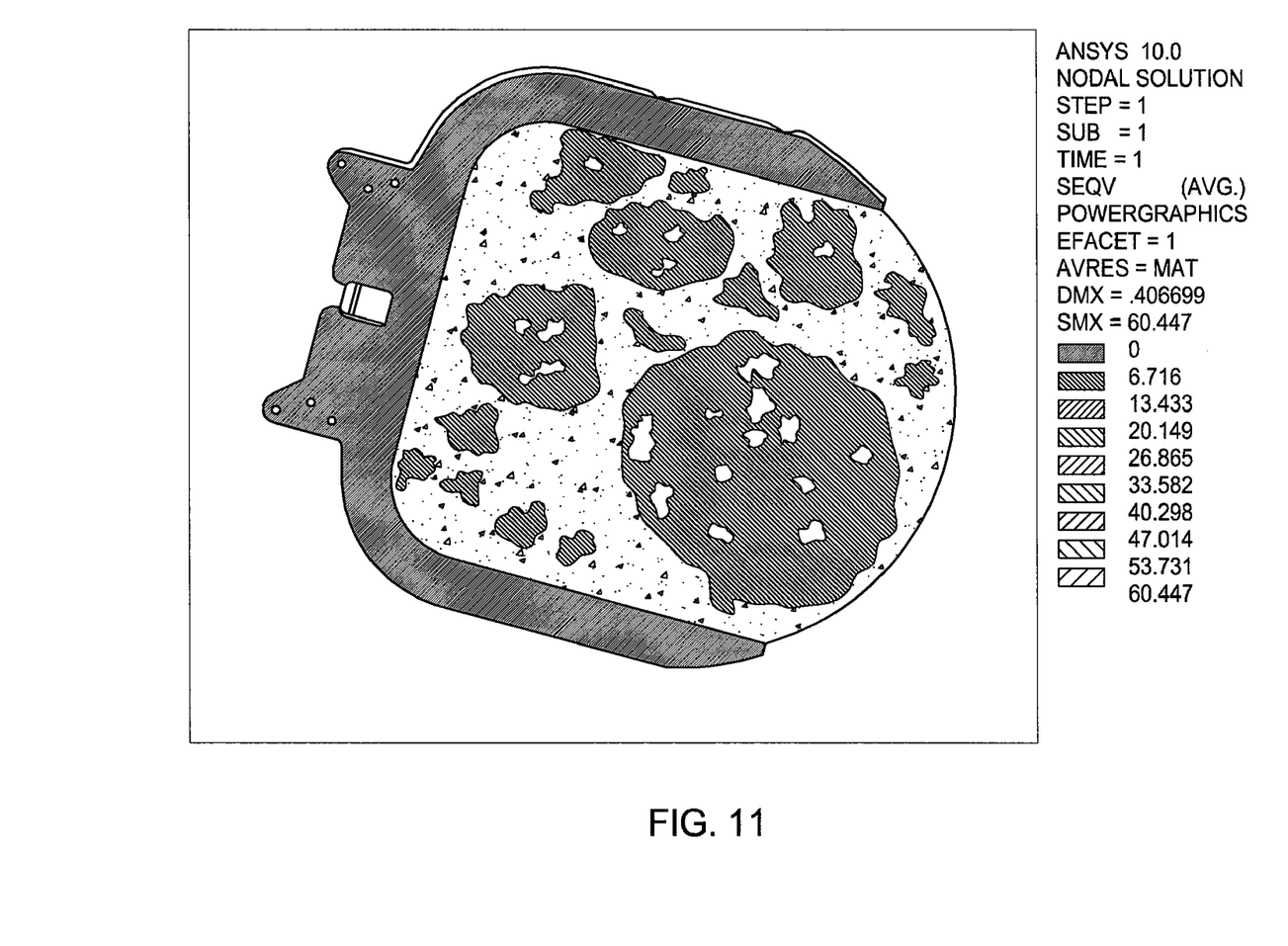
FIG. 11 depicts IR camera testing showing comparative substrate mapping as FEA of the blade according to one embodiment described herein.

FIG. 11 depicts IR camera testing showing comparative substrate mapping as FEA of the blade according to one embodiment described herein. The IR camera testing shows no concentrated stress points on the substrate and that substrate and blade deflection is minimized. A new blade that reduces thermal stress gradient on a hot substrate while allowing for extraction temperatures greater than 550° C. with reduced incidences of substrate breakage and warping has been provided. The blade allows for higher temperature extraction of substrates from processing chambers which has shown, for certain embodiments, a 10 second reduction in processing time per substrate, thus reducing overall processing time and cost of ownership.

While the foregoing is directed to embodiments of the present invention, other and further embodiments described herein may be devised without departing from the basic scope thereof, and the scope thereof is determined by the claims that follow.

The invention claimed is:

1. A u-shaped blade for transporting a substrate, comprising:
    a base having an arcuate lateral shoulder;
    a first finger extending outward from and perpendicular to the base;
    a second finger extending outward from the base and parallel to and spaced-apart from the first finger;
    a first support tab configured to support the substrate and positioned along the arcuate lateral shoulder;
    a second support tab configured to support the substrate and coupled with an angled portion of the first finger;
    a third support tab configured to support the substrate and coupled with an angled portion of the second finger; and
    a fourth support tab positioned along the arcuate lateral shoulder of the base and wherein each first support tab, each second support tab, each third support tab, and each fourth support tab has a first support surface for contacting a substrate at a first temperature and a second support surface for contacting the substrate at a second temperature and wherein the arcuate lateral shoulder extends from an outer edge of the first finger to an outer edge of the second finger.

2. The u-shaped blade of claim 1, wherein the first support tab and the fourth support tab are positioned between about 15° and about 20° from a center line parallel to the first finger and the second finger that bisects the base of the blade.

3. The u-shaped blade of claim 2, wherein the second support tab and the third support tab are positioned between about 25° and about 30° from a horizontal line that is perpendicular to the center line parallel to the first finger and the second finger that bisects the base of the blade.

4. The u-shaped blade of claim 1, wherein the first temperature is greater than the second temperature.

5. The u-shaped blade of claim 4, wherein the first support surface of the first support tab, the second support tab, the third support tab, and the fourth support tab form a first pocket for supporting a substrate and the second surface of the first support tab, the second support tab, the third support tab, and the fourth support tab form a second pocket for supporting a substrate.

6. The u-shaped blade of claim 1, wherein each first support tab, each second support tab, each third support tab, and each fourth support tab further comprise:
    a first contact slope angled downward toward the first support surface; and
    a second contact slope angled downward from the first support surface toward the second support surface, wherein the second contact slope couples the first support surface with the second support surface.

* * * * *